US012543269B2

(12) United States Patent
Chen et al.

(10) Patent No.: US 12,543,269 B2
(45) Date of Patent: Feb. 3, 2026

(54) MANUFACTURING METHOD OF ELECTRONIC DEVICE

(71) Applicant: Innolux Corporation, Miaoli County (TW)

(72) Inventors: Pei-Chi Chen, Miaoli County (TW); Wen-Chi Fang, Miaoli County (TW); Jen-Hai Chi, Miaoli County (TW); Zhi-Fu Huang, Miaoli County (TW); Jia-Sin Lin, Miaoli County (TW); Wan-Chun Tsai, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 632 days.

(21) Appl. No.: 17/976,866

(22) Filed: Oct. 30, 2022

(65) Prior Publication Data

US 2023/0171896 A1    Jun. 1, 2023

Related U.S. Application Data

(60) Provisional application No. 63/284,016, filed on Nov. 30, 2021.

(30) Foreign Application Priority Data

Aug. 16, 2022    (CN) .......................... 202210981845.8

(51) Int. Cl.
  *H05K 3/00*    (2006.01)
  *H05K 3/30*    (2006.01)
(52) U.S. Cl.
  CPC ............. *H05K 3/0044* (2013.01); *H05K 3/30* (2013.01); *H05K 2201/10106* (2013.01);
(Continued)

(58) Field of Classification Search
  CPC ................... H05K 3/0044; H05K 3/30; H05K 2203/0228; H05K 2203/025;
(Continued)

(56) References Cited

U.S. PATENT DOCUMENTS 10,128,223 B2 * 11/2018 Kawasaki ............... H01L 24/09
10,204,879 B2    2/2019 Lin et al.
(Continued)

FOREIGN PATENT DOCUMENTS

TW      200743146      11/2007
WO      2020174529      9/2020

OTHER PUBLICATIONS

"Office Action of Taiwan Counterpart Application", issued on Nov. 27, 2023, p. 1-p. 5.
(Continued)

*Primary Examiner* — Donghai D Nguyen
(74) *Attorney, Agent, or Firm* — JCIPRNET (57) ABSTRACT

A manufacturing method of an electronic device including following steps is provided. A first substrate is provided. A thermal release adhesive layer is provided on the first substrate. A thinning process is performed on the first substrate to form a first thinned substrate. A cutting process is performed on the first thinned substrate to form a first sub-substrate. The thermal release adhesive layer is separated from the first thinned substrate or the first sub-substrate. In the manufacturing method of the electronic device provided in one or more embodiments of the disclosure, the manufacturing process of the electronic device may be simplified, and/or defects of the resultant electronic device may be reduced.

18 Claims, 8 Drawing Sheets

(52) U.S. Cl.
CPC .............. *H05K 2201/10174* (2013.01); *H05K 2203/0228* (2013.01); *H05K 2203/025* (2013.01); *H05K 2203/0264* (2013.01)

(58) Field of Classification Search
CPC .. H05K 2203/0264; H01L 2221/68327; H01L 21/6836; H01L 21/78; Y10T 29/49128; Y10T 29/4913; Y10T 29/49789
See application file for complete search history.

(56) References Cited

U.S. PATENT DOCUMENTS

| | | | |
|---|---|---|---|
| 11,508,692 B2 * | 11/2022 | Yeh | H01L 24/97 |
| 2005/0227415 A1 | 10/2005 | Farnworth et al. | |
| 2010/0233868 A1 * | 9/2010 | Maeda | H01L 21/6835 |
| | | | 438/464 |
| 2014/0038357 A1 | 2/2014 | Arnold et al. | |

OTHER PUBLICATIONS

"Office Action of Taiwan Counterpart Application", issued on May 4, 2023, pp. 1-4.
"Search Report of Europe Counterpart Application", issued on May 10, 2023, pp. 1-7.

* cited by examiner

MANUFACTURING METHOD OF ELECTRONIC DEVICE

CROSS-REFERENCE TO RELATED APPLICATION

This application claims the priority benefit of U.S. provisional application Ser. No. 63/284,016, filed on Nov. 30, 2021, and China application serial no. 202210981845.8, filed on Aug. 16, 2022. The entirety of each of the above-mentioned patent applications is hereby incorporated by reference herein and made a part of this specification.

BACKGROUND

Technical Field

The disclosure relates to a manufacturing method of an electronic device.

Description of Related Art

As for applications of electronic devices, one of the development trends in the electronic devices is the requirement for light weight, small thickness, compactness, and small size. However, in order to make the electronic device lighter, thinner, more compact, and smaller, a thinning process, a cutting process, or the like may be performed, which may lead to various problems in the processes. Therefore, the electronic devices still face challenges of simplifying the manufacturing process and improving quality, yield, performance, and reliability.

SUMMARY

The disclosure provides a manufacturing method of an electronic device, which may simplify a manufacturing process of an electronic device and/or reduce defects.

According to some embodiments of the disclosure, a manufacturing method of an electronic device includes following steps. A first substrate is provided. A thermal release adhesive layer is provided on the first substrate. A thinning process is performed on the first substrate to form a first thinned substrate. A cutting process is performed on the first thinned substrate to form a first sub-substrate. The thermal release adhesive layer is separated from the first thinned substrate or the first sub-substrate.

In order for the features and advantages of the disclosure to be more comprehensible, the following specific embodiments are described in detail in conjunction with the drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles provided in the disclosure.

DESCRIPTION OF THE EMBODIMENTS

The disclosure may be understood by referring to the following detailed description with reference to the accompanying drawings. It is noted that for comprehension of the reader and simplicity of the drawings, in the drawings provided in the disclosure, only a part of the electronic device is shown, and certain devices in the drawings are not necessarily drawn to actual scale. Moreover, the quantity and the size of each device in the drawings are only schematic and exemplary and are not intended to limit the scope of protection provided in the disclosure.

Certain terminologies will be used to refer to specific devices throughout the specification and the appended claims of the disclosure. People skilled in the art should understand that manufacturers of electronic devices may refer to same elements under different names. The disclosure does not intend to distinguish devices with the same functions but different names. In the following specification and claims, the terminologies "including," "containing," "having," etc. are open-ended terminologies, so they should be interpreted to mean "including but not limited to . . . ". Therefore, when the terms "including," "containing," and/or "having" are used in the description of the disclosure, the terminologies designate the presence of a corresponding feature, region, step, operation, and/or element, but do not exclude the presence of one or more corresponding features, regions, steps, operations, and/or elements.

Directional terminologies mentioned herein, such as "top", "bottom", "front", "back", "left", "right", and so forth, refer to directions in the accompanying reference drawings. Accordingly, the directional terminologies provided herein serve to describe rather than limiting the disclosure. In the accompanying drawings, each figure illustrates methods applied in particular embodiments and general features of structures and/or materials in the embodiments. However, these figures should not be construed or defined as the scope covered by the particular embodiments. For instance, relative dimensions, thicknesses, and positions of various layers, regions, and/or structures may be reduced or enlarged for clarity.

When a corresponding element (such as a film layer or a region) is referred to as being "on another element", the element may be directly on the other element or there may be another element between the two. On the other hand, when an element is referred to as being "directly on another element", there is no element between the two. Also, when an element is referred to as being "on another element", the two have a top-down relationship in the top view direction, and the element may be above or below the other element, and the top-down relationship depends on the orientation of the device.

The terminologies "about", "equal to", "equivalent to" or "same", "substantially" or "approximately" are generally interpreted as being within 20% of a given value or range, or interpreted as being within 10%, 5%, 3%, 2%, 1%, or 0.5% of a given value or range.

The terminologies such as "first", "second", etc. may be used to describe elements, but the elements should not be limited by these terminologies. The terminologies are only intended to distinguish an element from another element in the specification. It is possible that the claims do not use the same terminologies and replace the terminologies with "first", "second", etc. according to the sequence provided in the claims. Accordingly, in the specification, a first element may be a second element in the claims.

It should be understood that the following embodiments may replace, reorganize, and mix the features in several different embodiments to complete other embodiments without departing from the spirit of the disclosure. As long as the features of the embodiments do not violate the spirit of the disclosure or conflict each other, they may be mixed and matched as desired.

An electrical connection or coupling relationship described in this disclosure may refer to a direct connection or an indirect connection. In the case of the direct connection, end points of the elements on two circuits are directly connected or connected to each other by a conductor segment, and in the case of the indirect connection, there are switches, diodes, capacitors, inductors, resistors, other appropriate elements, or a combination of the above elements between the end points of the elements on the two circuits, which should not be construed as a limitation in the disclosure.

In this disclosure, measurement of length, width, thickness, height, or area, or measurement of distance or interval between elements may be done by applying an optical microscope (OM), a scanning electron microscope (SEM), an alpha step ($\alpha$-step) profilometer, an ellipsometer, or any other appropriate measurement method. Specifically, according to some embodiments, the SEM may be applied to obtain a cross-sectional image of a to-be-measured element, and the width, the thickness, the height, or the area of each element or the distance or the interval between the elements may be measured, which should not be construed as a limitation in the disclosure. In addition, certain errors between any two values or directions for comparison may be acceptable. If a first value is equal to a second value, it indicates that a margin of error of about 10% may exist between the first and second values. If a first direction is perpendicular to a second direction, an angle difference between the first direction and the second direction may be between 80 degrees and 100 degrees; if the first direction is parallel to the second direction, an angle difference between the first direction and the second direction may be between 0 degrees and 10 degrees.

The electronic device disclosed in the embodiments of the disclosure may have a circuit structure of composite layers and may perform functions including the functions of an antenna, a display device, a light emitting device, a sensing device, a touch control device, a tiled device, or a packaging device, other appropriate functions, or a combination of the aforesaid functions, which should however not be construed as a limitation in the disclosure. The electronic device may include but may not be limited to a bendable or flexible electronic device. The electronic device may include, for example, liquid crystal, light emitting diode (LED), quantum dot (QD), fluorescence, phosphor, a packaging element, any other appropriate material, or a combination of the foregoing. The display device or the tiled device will serve as the electronic device in the disclosure, which should however not be construed as a limitation in the disclosure. The electronic elements may include passive elements and active elements, such as capacitors, resistors, inductors, diodes, transistors, circuit boards, chips, dies, integrated circuits (IC), packaging elements, a combination of the foregoing, or any other appropriate electronic elements, which should not be construed as a limitation in the disclosure. The diodes may include the LEDs, photodiodes, or varactor diodes, but is not limited thereto. The LEDs may include, for example, organic light emitting diodes (OLED), sub-millimeter light emitting diodes (mini LED), micro light emitting diodes (micro LED), or quantum dot light emitting diodes (quantum dot LED), but is not limited thereto. The packaging elements may include redistribution layers, wafer level packaging (WLP) elements, panel level packaging (PLP) elements, and so on, but is not limited thereto.

Reference will now be made in detail to the exemplary embodiments of the disclosure, and examples of the exemplary embodiments are illustrated in the accompanying drawings. Whenever possible, the same reference numbers are used in the drawings and descriptions to indicate the same or similar parts.

Figure 1A:
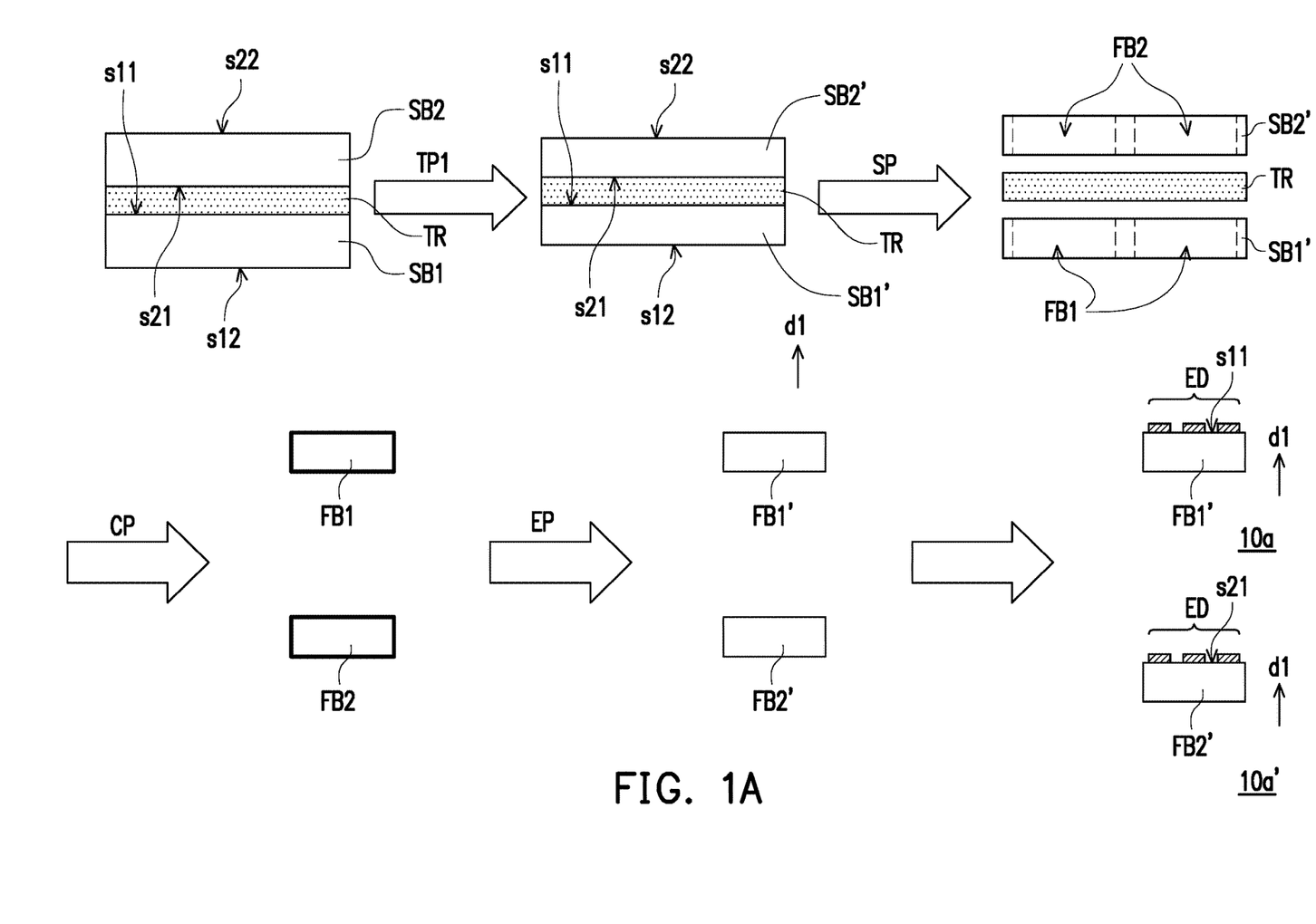
FIG. 1A is a cross-sectional flowchart of a manufacturing method of a portion of an electronic device according to a first embodiment of the disclosure.
Figure 1B:
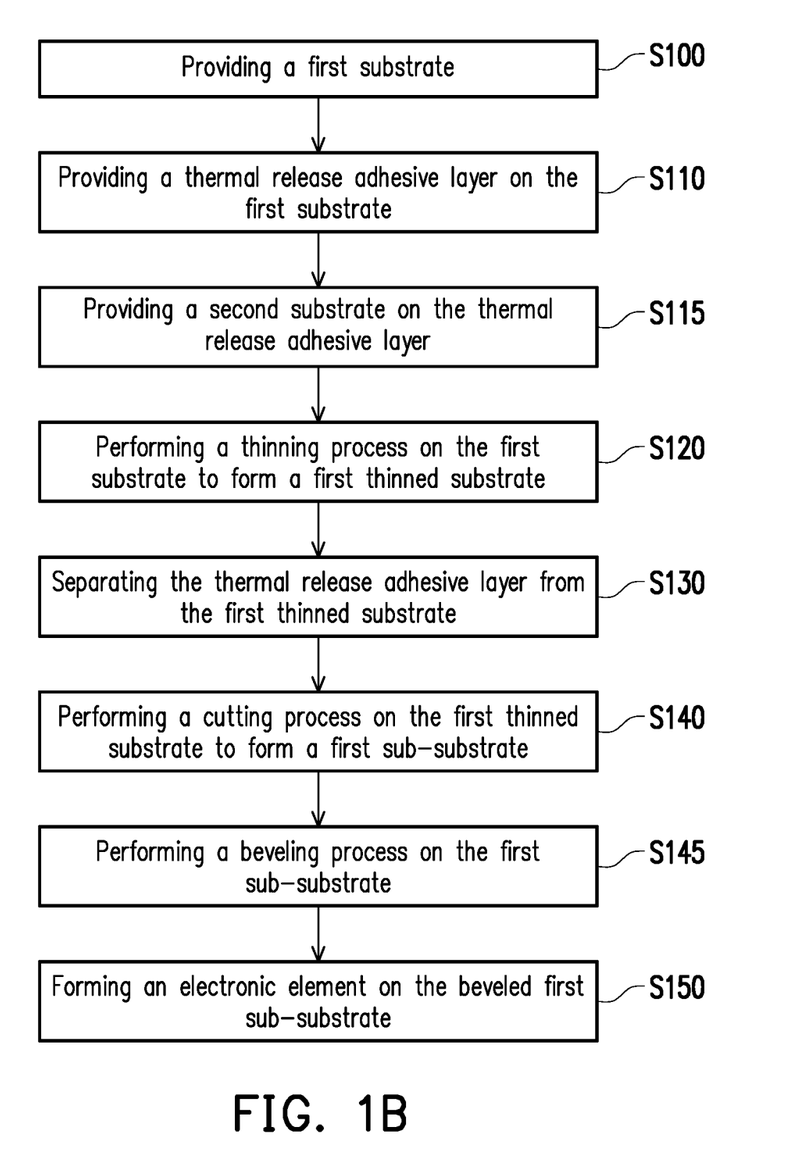
FIG. 1B is a cross-sectional flowchart of some steps of the manufacturing method of the electronic device according to the first embodiment of the disclosure.

FIG. 1A is a cross-sectional flowchart of a manufacturing method of a portion of an electronic device according to a first embodiment of the disclosure, and FIG. 1B is a cross-sectional flowchart of some steps of the manufacturing method of the electronic device according to the first embodiment of the disclosure.

With reference to FIG. 1A and FIG. 1B, in step S100, a first substrate SB1 is provided. The first substrate SB1 may include a rigid substrate or a flexible substrate, and a material of the first substrate SB1 may include glass, quartz, sapphire, a plastic material, or a combination of the above materials, which should not be construed as a limitation in the disclosure. In addition, light transmittance of the first substrate SB1 is not limited in this embodiment; that is, the first substrate SB1 may be, for instance, a transparent substrate, a semi-transparent substrate, or an opaque substrate. In this embodiment, a material of the first substrate SB1 is glass. In some embodiments, the first substrate SB1 may be a circuit substrate. The circuit substrate may, for instance, include a substrate and a circuit layer disposed on the substrate, where the circuit layer may include a switch element, a driver element, a display element, a sensing element, a circuit redistribution layer, a signal line, a bonding pad, or other appropriate elements, for instance, and the signal line may be a combination of, for instance, a scan line, a data line, and a power line, which should however not be construed as a limitation in the disclosure. In some embodiments, electronic elements (not shown) may be disposed on the first substrate SB1 according to the requirements of the electronic device, where the electronic elements may include passive elements and active elements, such as capacitors, resistors, inductors, diodes, transistors, circuit boards, chips, dies, integrated circuits (IC), packaging elements, a combination of the aforesaid elements, or other appropriate electronic elements, which should not be construed as a limitation in the disclosure.

In step S110, a thermal release adhesive layer TR is provided on the first substrate SB1. The first substrate SB1 has, for instance, a surface s11 and a surface s12 opposite to each other, and a circuit layer (not shown) is, for instance, disposed on the surface s11 of the first substrate SB1. In some embodiments, the thermal release adhesive layer TR is in contact with the surface s11 of the first substrate SB1 where the circuit layer is disposed. The thermal release adhesive layer TR may, for instance, be configured to temporarily bond the first substrate SB1 to other components; alternatively, the thermal release adhesive layer TR may, for instance, act as a protection layer of the first substrate SB1, which should not be construed as a limitation in the disclosure. A material of the thermal release adhesive layer TR may, for instance, include acrylic resin, etc., and its viscosity may be reduced when the temperature of the thermal release adhesive layer TR is raised to a specific temperature, which should not be construed as a limitation in the disclosure.

In step S115, a second substrate SB2 is provided on the thermal release adhesive layer TR. The second substrate SB2 may be, for instance, identical or similar to the first substrate SB1, and no further description is provided hereinafter. The second substrate SB2 has, for instance, a surface s21 and a surface s22 opposite to each other, and a circuit layer (not shown) is, for instance, disposed on the surface s21 of the second substrate SB2, for example. In some embodiments, the surface s21 of the second substrate SB2 where the circuit layer is disposed is in contact with the thermal release adhesive layer TR. From another perspective, the thermal release adhesive layer TR is disposed between the first substrate SB1 and the second substrate SB2 in a first direction d1.

In step S120, a thinning process TP1 is performed on the first substrate SB1 to form a first thinned substrate SB1'. In some embodiments, the thinning process TP1 performed on the first substrate SB1 may include an etching process, a polishing process, or a combination thereof. In this embodiment, the thinning process TP1 performed on the first substrate SB1 is a wet etching process, where an etchant applied in the wet etching process includes hydrofluoric acid, which should however not be construed as a limitation in the disclosure. Note that this embodiment further includes a step of performing the thinning process TP1 on the second substrate SB2 to form a second thinned substrate SB2'. Specifically, after the thinning process TP1 is performed, a portion of the first substrate SB1 and a portion of the second substrate SB2 may be removed to form the first thinned substrate SB1' and the second thinned substrate SB2'. For instance, the surface s12 of the first substrate SB1 away from the thermal release adhesive layer TR and the surface s22 of the second substrate SB2 away from the thermal release adhesive layer TR may be etched by applying the etchant, so as to reduce a thickness of the first thinned substrate SB1' in the first direction d1 and a thickness of the second thinned substrate SB2' in the first direction d1.

In step S130, the thermal release adhesive layer TR is separated from the first thinned substrate SB1'. That is, a separation process SP is performed on the thermal release adhesive layer TR and the first thinned substrate SB1'. In some embodiments, the thermal release adhesive layer TR may be separated from the first thinned substrate SB1' by raising the temperature to an appropriate temperature for reducing the viscosity of the thermal release adhesive layer TR. For instance, the thermal release adhesive layer TR may be separated from the first thinned substrate SB1' by performing a dry pyrolysis process or a wet pyrolysis process, where the dry pyrolysis process includes applying a bake oven, and the wet pyrolysis process includes applying a water tank, which should however not be construed as a limitation in the disclosure. Whether the viscosity of the thermal release adhesive layer TR is reduced may be determined by whether the color of the thermal release adhesive layer TR is changed after the temperature is raised, which should however not be construed as a limitation in the disclosure. Note that this embodiment further includes a step of separating the thermal release adhesive layer TR from the second thinned substrate SB2'.

In step S140, a cutting process CP is performed on the first thinned substrate SB1' to form a first sub-substrate FB1. In some embodiments, the cutting process CP performed on the first thinned substrate SB1' includes performing a laser cutting process, a wheel cutting process, or a combination thereof. In this embodiment, the cutting process CP performed on the first thinned substrate SB1' is the laser cutting process, which should however not be construed as a limitation in the disclosure. For instance, the first thinned substrate SB1' may be cut by applying a laser cutting element (not shown). The laser cutting element may include a laser generating unit (not shown) and a laser control unit (not shown), for instance, where the laser generating unit may generate a laser beam and irradiate a surface of the first thinned substrate SB1' by the laser beam for performing the cutting process on the first thinned substrate SB1'; the laser control unit is, for instance, electrically connected to the laser generating unit and may be configured to receive laser control parameters from, for instance, a processing device (not shown) to control the energy level and the injection timing of the laser beam generated by the laser generating unit, which should however not be construed as a limitation in the disclosure. Note that this embodiment further includes a step of performing the cutting process CP on the second thinned substrate SB2' to form a second sub-substrate FB2.

Although the thermal release adhesive layer TR is separated from the first thinned substrate SB1' before the cutting process CP is performed on the first thinned substrate SB1' in this embodiment, this should however not be construed as a limitation in the disclosure. In some embodiments, the thermal release adhesive layer TR is separated from the first sub-substrate FB1 after the cutting process CP is performed on the first thinned substrate SB1' to form the first sub-substrate FB1.

In some embodiments, after the cutting process CP is performed on the first thinned substrate SB1' to form the first sub-substrate FB1, a step S145 of performing a beveling process EP on the first sub-substrate FB1 is further performed. For instance, the beveling process EP may be performed on the first sub-substrate FB1 by applying a beveling element (not shown) to form a beveled first sub-substrate FB1'. In some embodiments, the beveling process EP may be performed in a negative pressure environment without applying any slurry, or the beveling process EP may be performed with use of a slurry, which should not be construed as a limitation in the disclosure. By performing the beveling process EP on the first sub-substrate FB1, cracks or defects that may be generated by the cutting process CP may be removed, so as to improve the strength and/or the reliability of the beveled first sub-substrate FB In some embodiments, the beveled first sub-substrate FB1' may be chamfered by performing the beveling process EP on the first sub-substrate FB1, which should however not be construed as a limitation in the disclosure.

In step S150, an electronic element ED is formed or disposed on the beveled first sub-substrate FB1' to form an electronic device 10a. In some embodiments, the number of the electronic element ED may be plural. The electronic elements ED may be arranged in an array, alternately arranged (e.g., in a pentile manner), or arranged in another manner on the surface s11 of the beveled first sub-substrate FB1', and the electronic elements ED may be electrically connected to the circuit layer, for instance, which should however not be construed as a limitation in the disclosure. In this embodiment, the electronic elements ED includes diodes, such as varactor diodes, which should however not be construed as a limitation in the disclosure. In some embodiments, the electronic elements ED include a plurality of light emitting elements that may emit light of various appropriate colors or UV light, such as organic light emitting diodes (OLED), inorganic light emitting diodes (inorganic LED), mini LED, micro LED, quantum dots (QD), quantum dot LED (QLED or QDLED), light emitting elements made of fluorescence, phosphor, other appropriate materials, or a combination of the above materials, which should however not be construed as a limitation in the disclosure. In some embodiments, the electronic elements ED may include packaging elements, such as circuit redistribution layers, PLP, elements, and so on, which should however not be construed as a limitation in the disclosure. According to this embodiment, note that the beveling process EP may be further performed on the second sub-substrate FB2 to form a beveled second sub-substrate FB2'. In addition, this embodiment may further include a step of forming or disposing the electronic element ED on the surface s21 of the beveled second sub-substrate FB2' to form an electronic device 10a', which should not be construed as a limitation in the disclosure.

So far, the manufacturing process of the electronic device 10a and/or the electronic device 10a' is completed. Although the manufacturing method of the electronic device 10a and/or the electronic device 10a' provided in this embodiment is exemplarily described by taking the above manufacturing process as an example, the manufacturing method of the electronic device 10a and/or the electronic device 10a' provided in the disclosure is not limited to what is described above. According to actual demands, some steps in the aforesaid manufacturing process may be deleted, or other steps may be added to the aforesaid manufacturing process. In addition, the order of the above steps may be adjusted according to actual needs.

Figure 2A:
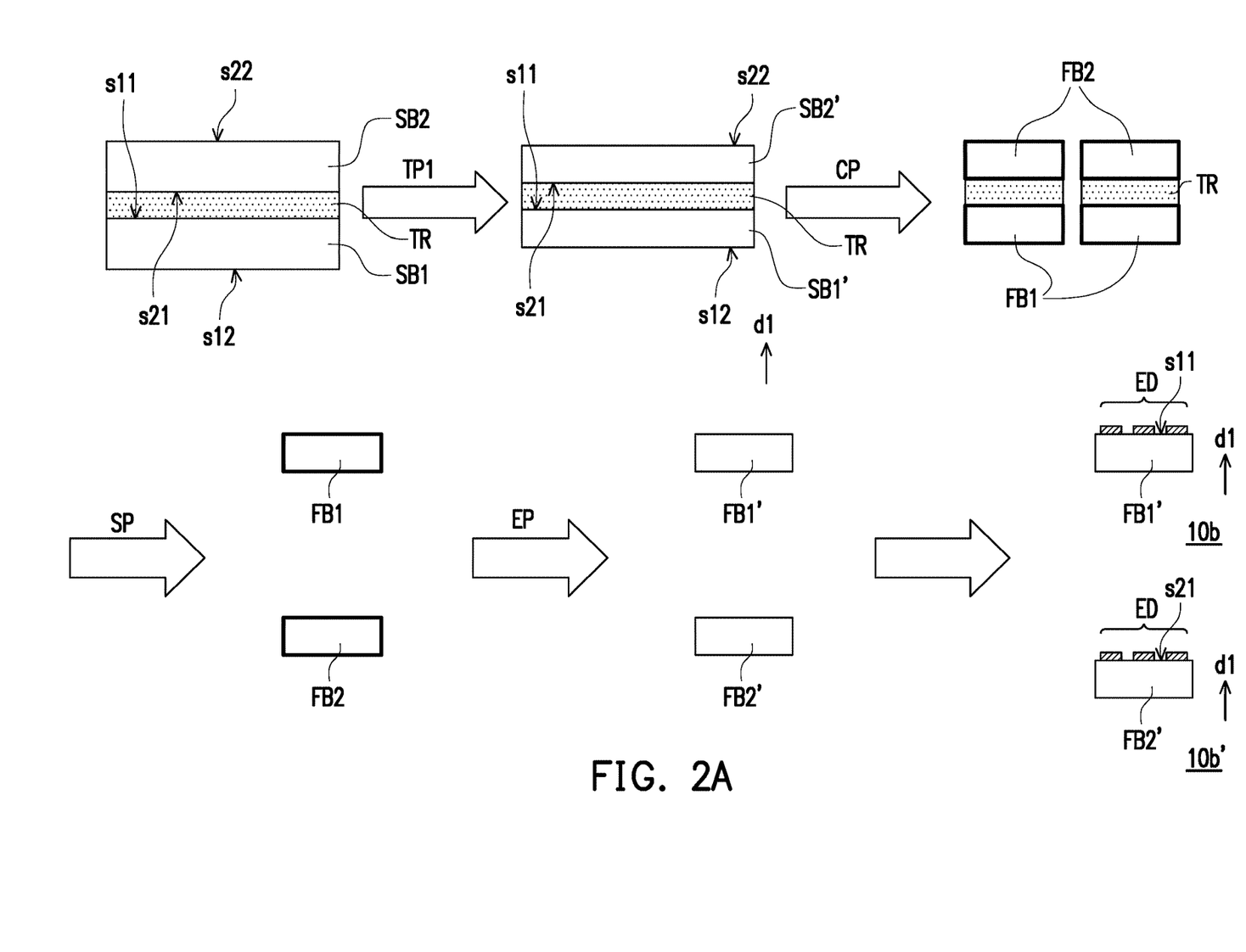
FIG. 2A is a cross-sectional flowchart of a manufacturing method of a portion of an electronic device according to a second embodiment of the disclosure.
Figure 2B:
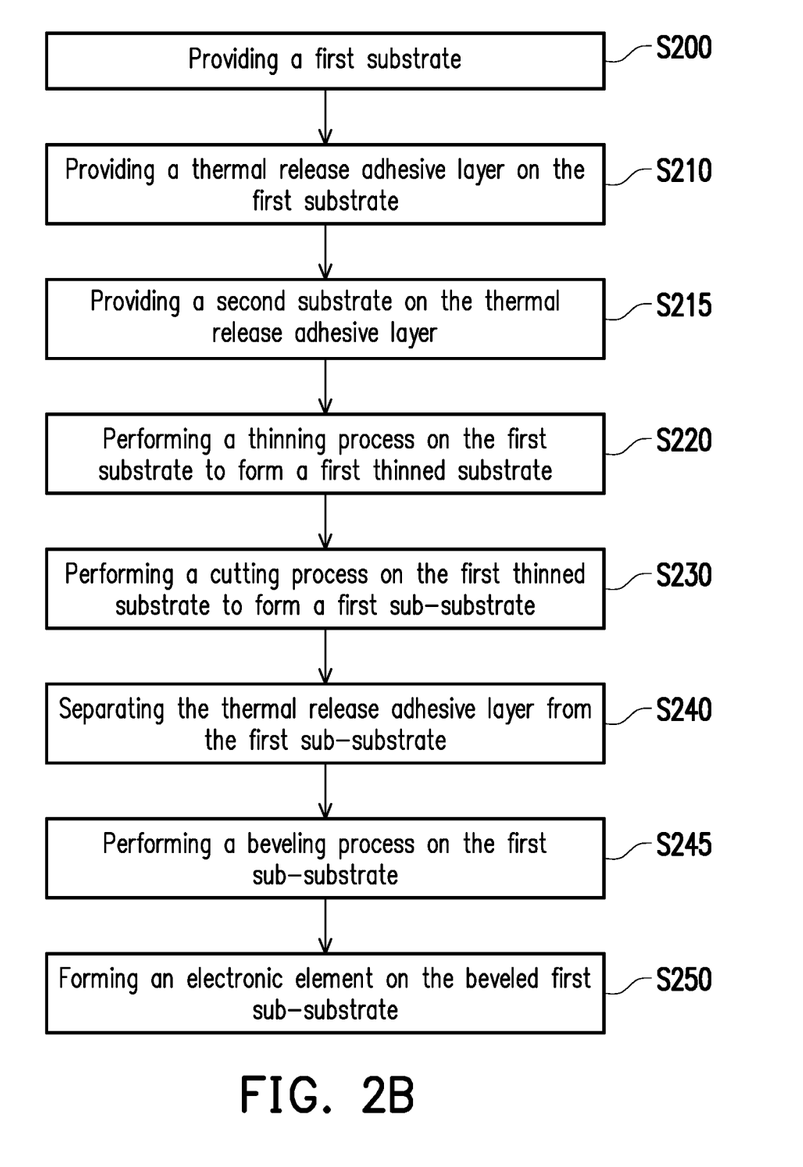
FIG. 2B is a cross-sectional flowchart of some steps of the manufacturing method of the electronic device according to the second embodiment of the disclosure.

FIG. 2A is a cross-sectional flowchart of a manufacturing method of a portion of an electronic device according to a second embodiment of the disclosure, and FIG. 2B is a cross-sectional flowchart of some steps of the manufacturing method of the electronic device according to the second embodiment of the disclosure. Note that the reference numbers and some content provided in the embodiment shown in FIG. 2A and FIG. 2B are derived from those provided in the embodiment shown in FIG. 1A and FIG. 1B, respectively, where the same or similar reference numbers serve to denote the same or similar elements, and the description of the same technical content is omitted.

The difference between a manufacturing method of an electronic device 10b and/or an electronic device 10b' shown in FIG. 2A and FIG. 2B and one of the manufacturing method of the electronic device 10a and the manufacturing method of the electronic device 10a' lies in that the thermal release adhesive layer TR is separated from the first sub-substrate FB1 after the cutting process CP is performed on the first thinned substrate SB1' to form the first sub-substrate FB1.

With reference to FIG. 2A and FIG. 2B, step S200, step S210, step S215, step S220, step S245, and step S250 may be the same as or similar to the step S100, the step S110, the step S115, the step S120, the step S145, and the step S150, for instance, and therefore no further description is provided hereinafter.

In step S230, the cutting process CP is performed on the first thinned substrate SB1' to form the first sub-substrate FB1. Note that this embodiment further includes a step of performing the cutting process CP on the second thinned substrate SB2' to form the second sub-substrate FB2, where the cutting process CP may be performed on the first thinned substrate SB1' and the second thinned substrate SB2' at the same time. For instance, laser may be provided on both sides of the surface S22 and the surface S12, and the cutting process CP may be performed on the first thinned substrate SB1' and the second thinned substrate SB2' at the same time. Alternatively, the cutting process CP may also be performed on the first thinned substrate SB1' and the second thinned substrate SB2' by providing the laser on one side of the surface S22 or the surface S12, which should however not be construed as a limitation in the disclosure. In this embodiment, the cutting process CP performed on the first thinned substrate SB1' and the second thinned substrate SB2' includes the laser cutting process, where the method of performing the laser cutting process may be referred to as that provided in the previous embodiment and thus will not be further explained hereinafter.

In step S240, the thermal release adhesive layer TR is separated from the first sub-substrate FB1, where the method of separating the thermal release adhesive layer TR from the first sub-substrate FB1 may be referred to as that provided in the previous embodiment and thus will not be further explained hereinafter. Note that this embodiment further includes a step of separating the thermal release adhesive layer TR from the second sub-substrate FB2.

Although the thermal release adhesive layer TR is separated from the first sub-substrate FB1 after the cutting process CP is performed on the first thinned substrate SB1' in this embodiment, this should however not be construed as a limitation in the disclosure. In step S245, the beveling process EP is performed on the first sub-substrate FB1 according to this embodiment. In some embodiments, the step S245 shown in FIG. 2B may be inserted between the step S230 and the step S240; that is, after the cutting process CP is performed on the first thinned substrate SB1', the step S245 is carried out to perform the beveling process EP on the first sub-substrate FB1, and the step S240 is then performed to separate the thermal release adhesive layer TR from the beveled first sub-substrate FB In some embodiments, after the cutting process CP is performed on the second thinned substrate SB2', it is likely to perform the beveling process EP on the second sub-substrate FB2 and then separate the thermal release adhesive layer TR from the beveled second sub-substrate FB2'.

So far, the manufacturing process of the electronic device 10b and/or the electronic device 10b' is completed. Although the manufacturing method of the electronic device 10b and/or the electronic device 10b' provided in this embodiment is exemplarily described by taking the above manufacturing process as an example, the manufacturing method of the electronic device 10b and/or the electronic device 10b' provided in the disclosure is not limited to what is described above. According to actual demands, some steps in the aforesaid manufacturing process may be deleted, or other steps may be added to the aforesaid manufacturing process. In addition, the order of the above steps may be adjusted according to actual needs.

Figure 3A:
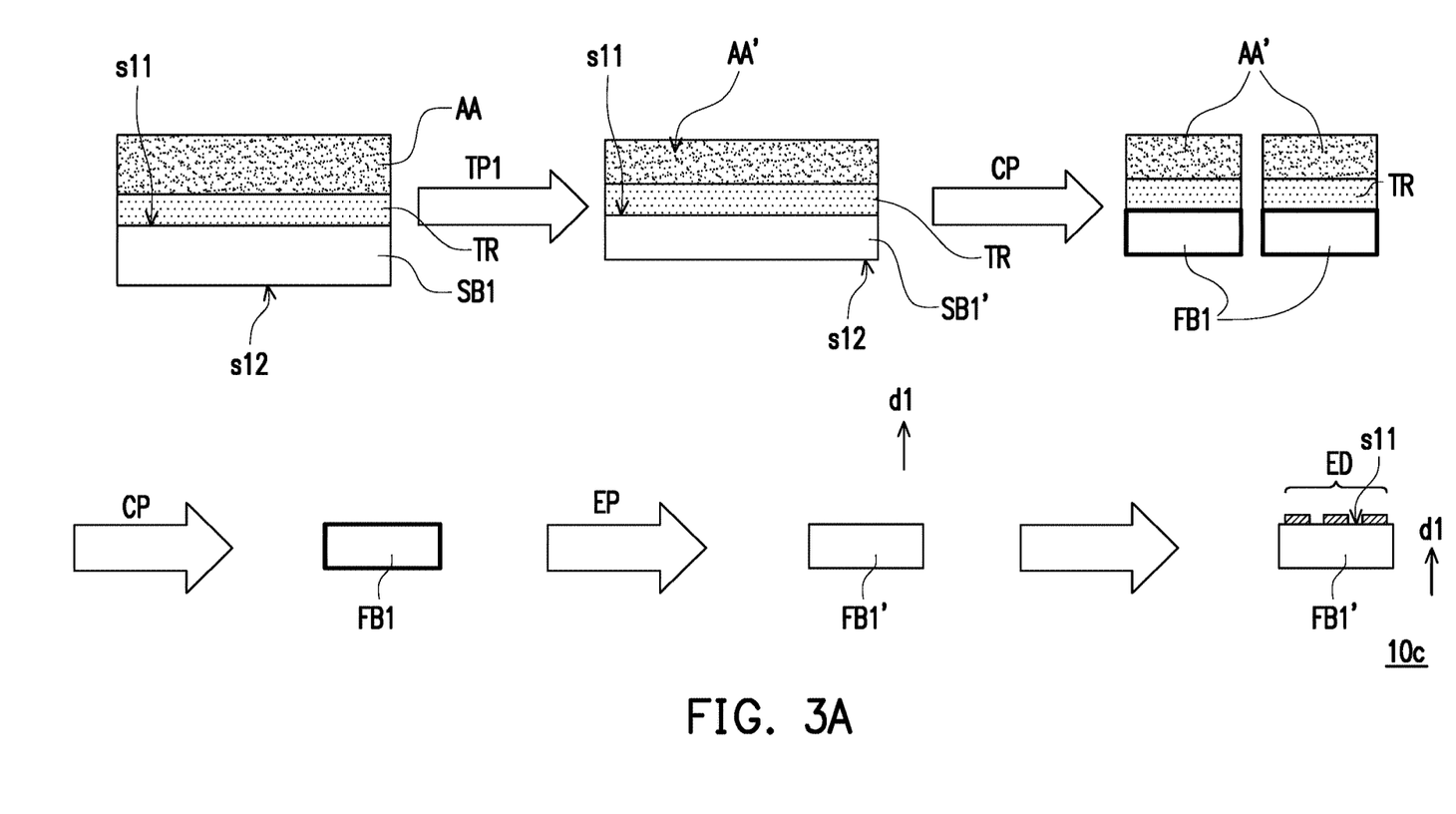
FIG. 3A is a cross-sectional flowchart of a manufacturing method of a portion of an electronic device according to a third embodiment of the disclosure.
Figure 3B:
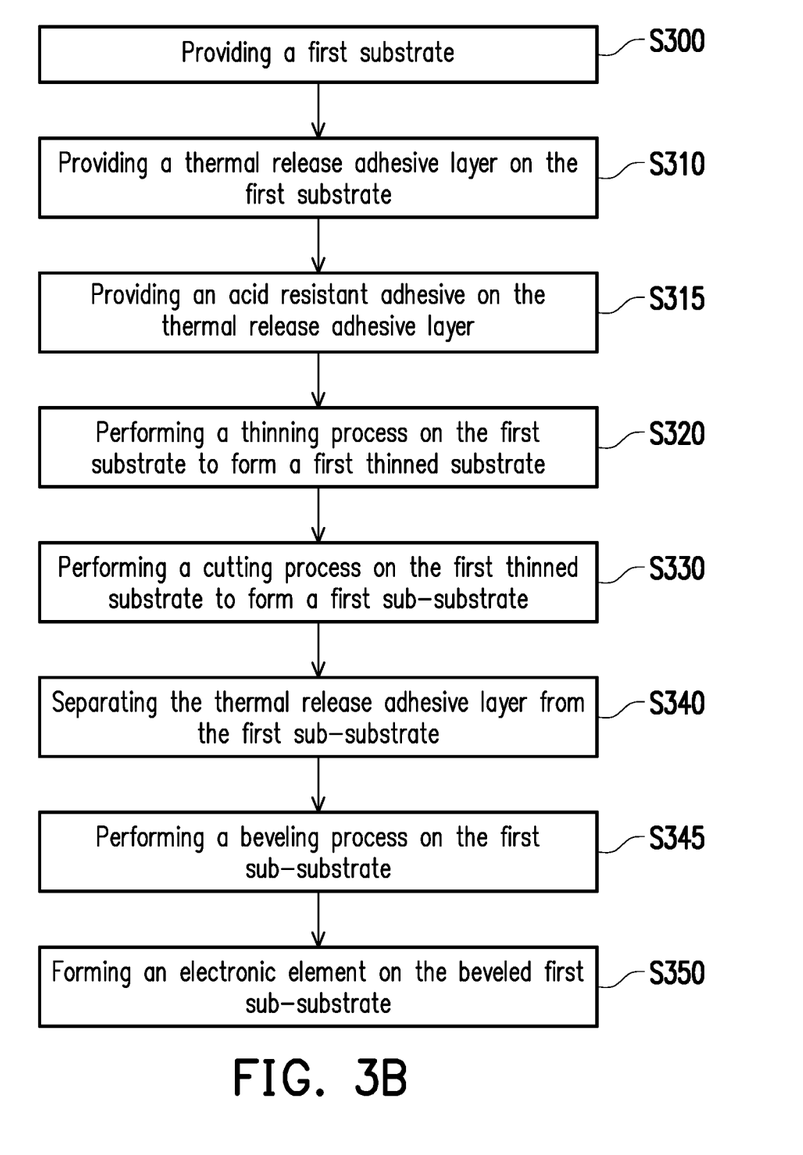
FIG. 3B is a cross-sectional flowchart of some steps of the manufacturing method of the electronic device according to the third embodiment of the disclosure.

FIG. 3A is a cross-sectional flowchart of a manufacturing method of a portion of an electronic device according to a third embodiment of the disclosure, and FIG. 3B is a cross-sectional flowchart of some steps of the manufacturing method of the electronic device according to the third embodiment of the disclosure. Note that the reference numbers and some content provided in the embodiment shown in FIG. 3A and FIG. 3B are derived from those provided in the embodiment shown in FIG. 1A and FIG. 1B, respectively, where the same or similar reference numbers serve to denote the same or similar elements, and the description of the same technical content is omitted.

With reference to FIG. 3A and FIG. 3B, in step S300, the first substrate SB1 is provided. The material and the components of the first substrate SB1 may be referred to as those provided in the previous embodiments and thus will not be further explained hereinafter.

In step S310, the thermal release adhesive layer TR is provided on the first substrate SB1. The material and the characteristics of the thermal release adhesive layer TR may be referred to as those provided in the previous embodiments and thus will not be further explained hereinafter.

In some embodiments, step S315 may be further performed to provide an acid resistant adhesive AA on the thermal release adhesive layer TR. In some embodiments, the acid resistant adhesive AA is in contact with the thermal release adhesive layer TR. From another perspective, the thermal release adhesive layer TR is disposed between the first substrate SB1 and the acid resistant adhesive AA in the first direction d1. The acid resistant adhesive AA may be, for instance, configured to reduce the corrosion of the first substrate SB1 due to the etchant applied in the subsequent wet etching process, and the acid resistant adhesive AA may serve as a protection layer of the first substrate SB1, which should however not be construed as a limitation in the disclosure. A material of the acid resistant adhesive AA may, for instance, include acrylic resin and other materials, and the acid resistant adhesive AA may be, for instance, a hydrofluoric acid resistant adhesive, which should however not be construed as a limitation in the disclosure.

In step S320, the thinning process TP1 is performed on the first substrate SB1 to form the first thinned substrate SB1'. In some embodiments, the thinning process TP1 performed on the first substrate SB1 may include the etching process, the polishing process, or a combination thereof. In this embodiment, the thinning process TP1 performed on the first substrate SB1 is the wet etching process, where the etchant applied in the wet etching process includes hydrofluoric acid, which should however not be construed as a limitation in the disclosure. After the thinning process TP1 is performed, a portion of the first substrate SB1 may be removed to form the first thinned substrate SB1'. For instance, the surface s12 of the first substrate SB1 away from the thermal release adhesive layer TR may be etched by applying the etchant, so that the thickness of the first thinned substrate SB1' in the first direction d1 is reduced. According to this embodiment, note that the surface s11 of the first substrate SB1 close to the thermal release adhesive layer TR may not be etched due to the arrangement of the acid resistant adhesive AA; that is, the acid resistant adhesive AA on the surface s11 of the first substrate SB1 is etched to form a thinned acid resistant adhesive AA'.

In step S330, the cutting process CP is performed on the first thinned substrate SB1' to form the first sub-substrate FB1. In this embodiment, the cutting process CP performed on the first thinned substrate SB1' includes the laser cutting process, where the method of performing the laser cutting process may be referred to as that provided in the previous embodiments and thus will not be further explained hereinafter. It is worth noting that this embodiment further includes a step of performing the cutting process CP on the thinned acid resistant adhesive AA'. In this embodiment, the energy level and/or the injection timing of the laser beam applied for performing the cutting process CP on the first thinned substrate SB1' may be different from the energy level and/or the injection timing of the laser beam applied for performing the cutting process CP on the thinned acid resistant adhesive AA', which should however not be construed as a limitation in the disclosure.

In step S340, the thermal release adhesive layer TR is separated from the first sub-substrate FB1; that is, the separation process SP is performed on the thermal release adhesive layer TR and the first sub-substrate FB1. Here, the method of separating the thermal release adhesive layer TR from the first sub-substrate FB1 may be referred to as that provided in the previous embodiments and thus will not be further explained hereinafter. Note that the thinned acid resistant adhesive AA' disposed on the thermal release adhesive layer TR is accordingly separated from the first sub-substrate FB1.

In some embodiments, after the cutting process CP is performed on the first thinned substrate SB1', step S345 of performing the beveling process EP on the first sub-substrate FB1 may be further carried out, so as to form the beveled first sub-substrate FB1', where the method of performing the beveling process EP on the first sub-substrate FB1 may be referred to as that provided in the previous embodiments and thus will not be further explained hereinafter. In some embodiments, the step S345 shown in FIG. 3B may be inserted between the step S330 and the step S340; that is, after the cutting process CP is performed on the first thinned substrate SB1', the step S345 is carried out to perform the beveling process EP on the first sub-substrate FB1, and the step S340 is then performed to separate the thermal release adhesive layer TR from the beveled first sub-substrate FB1'.

In step S350, the electronic element ED is formed or disposed on the surface S11 of the beveled first sub-substrate FB1' to form the electronic device 10c. The type of the electronic elements ED may be referred to as that provided in the previous embodiments and thus will not be further explained hereinafter So far, the manufacturing process of the electronic device 10c is completed. Although the manufacturing method of the electronic device 10c provided in this embodiment is exemplarily described by taking the above manufacturing process as an example, the manufacturing method of the electronic device 10c provided in the disclosure is not limited to what is described above. According to actual demands, some steps in the aforesaid manufacturing process may be deleted, or other steps may be added to the aforesaid manufacturing process. In addition, the order of the above steps may be adjusted according to actual needs.

Figure 4A:
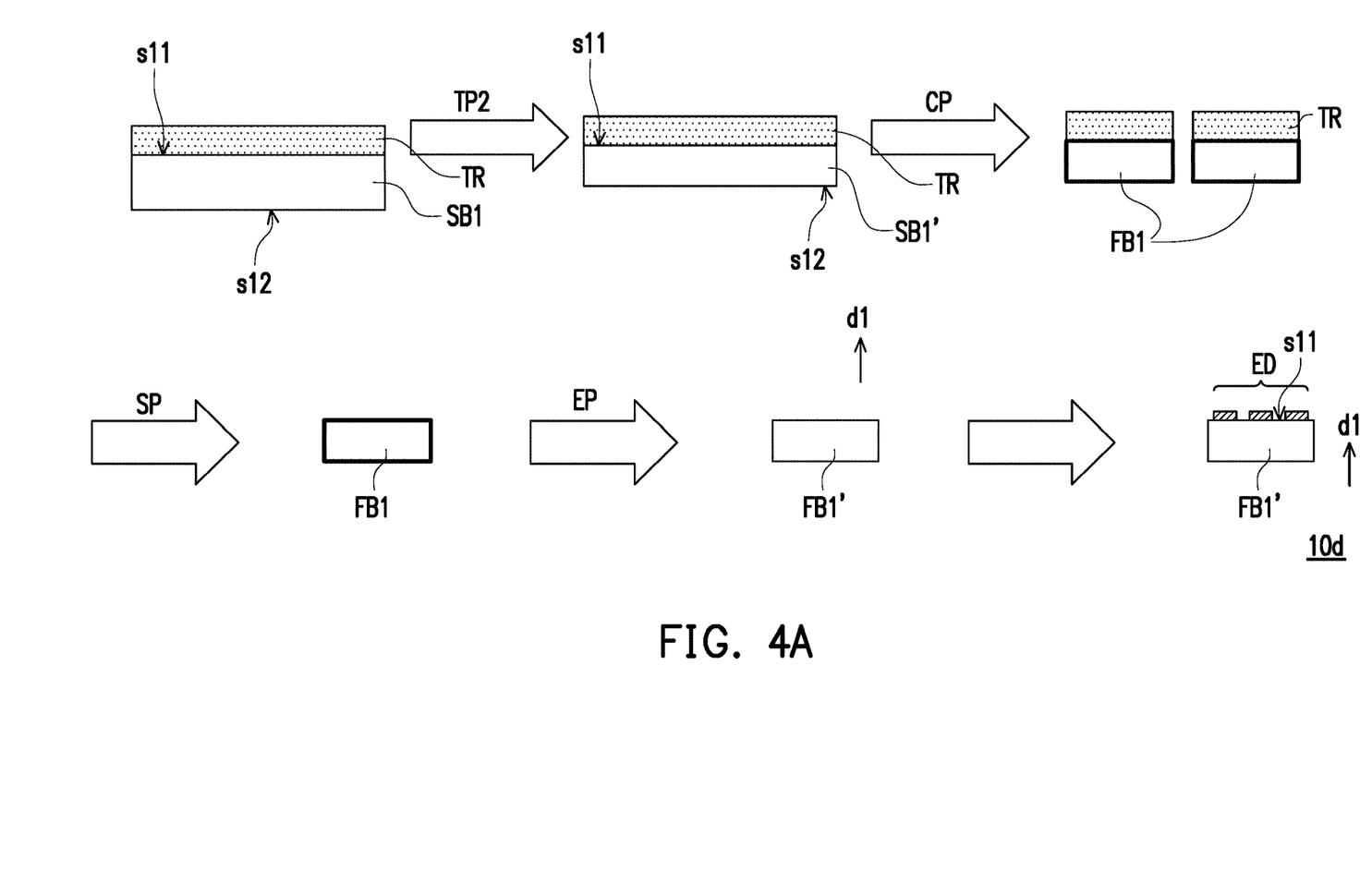
FIG. 4A is a cross-sectional flowchart of a manufacturing method of a portion of an electronic device according to a fourth embodiment of the disclosure.
Figure 4B:
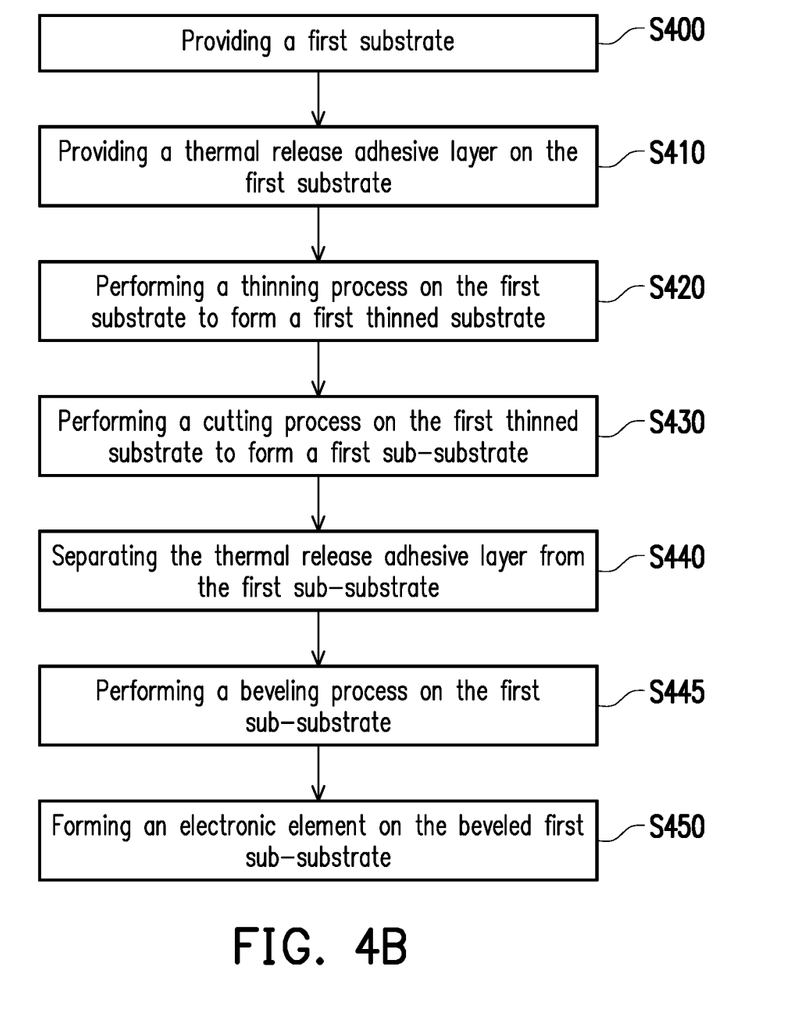
FIG. 4B is a cross-sectional flowchart of some steps of the manufacturing method of the electronic device according to the fourth embodiment of the disclosure.

FIG. 4A is a cross-sectional flowchart of a manufacturing method of a portion of an electronic device according to a fourth embodiment of the disclosure, and FIG. 4B is a cross-sectional flowchart of some steps of the manufacturing method of the electronic device according to the fourth embodiment of the disclosure. Note that the reference numbers and some content provided in the embodiment shown in FIG. 4A and FIG. 4B are derived from those provided in the embodiment shown in FIG. 3A and FIG. 3B, respectively, where the same or similar reference numbers serve to denote the same or similar elements, and the description of the same technical content is omitted.

The difference between a manufacturing method of an electronic device 10d and the manufacturing method of the electronic device 10c lies in that no acid resistant adhesive AA is provided on the first substrate SB1 in this embodiment, and a thinning process TP2 performed on the first substrate SB1 is the polishing process.

With reference to FIG. 4A and FIG. 4B, in step S400, the first substrate SB1 is provided. The material and the components of the first substrate SB1 may be referred to as those provided in the previous embodiments and thus will not be further explained hereinafter.

In step S410, the thermal release adhesive layer TR is provided on the first substrate SB1. The material and the characteristics of the thermal release adhesive layer TR may be referred to as those provided in the previous embodiments and thus will not be further explained hereinafter.

In step S420, the thinning process TP2 is performed on the first substrate SB1 to form the first thinned substrate SB1'. In this embodiment, the thinning process TP2 performed on the first substrate SB1 is the polishing process. For instance, the first substrate SB1 may be polished by applying a polishing element (not shown) to form the first thinned substrate SB1'. This polishing element may, for instance, include a polishing pad (not shown) and a polishing head (not shown), where the thinning process TP2 may be performed by applying mechanical energy to the first substrate SB1 through the polishing pad and the polishing head, for instance, which should however not be construed as a limitation in the disclosure.

In step S430, the cutting process CP is performed on the first thinned substrate SB1' to form the first sub-substrate FB1. In this embodiment, the cutting process CP performed on the first thinned substrate SB1' may include a laser cutting process or a wheel cutting process, where the method of performing the cutting process or the wheel cutting process may be referred to as that provided in the previous embodiments and thus will not be further explained hereinafter.

In step S440, the thermal release adhesive layer TR is separated from the first sub-substrate FB1; that is, the separation process SP is performed on the thermal release adhesive layer TR and the first sub-substrate FB1. The method of separating the thermal release adhesive layer TR from the first sub-substrate FB1 may be referred to as that provided in the previous embodiments and thus will not be further explained hereinafter.

In some embodiments, after the cutting process CP is performed on the first thinned substrate SB1', step 445 is further carried out by performing the beveling process EP on the first sub-substrate FB1 to form the beveled first sub-substrate FB1', where the method of performing the beveling process EP on the first sub-substrate FB1 may be referred to as that provided in the previous embodiments and thus will not be further explained hereinafter. In some embodiments, the step S445 shown in FIG. 4B may be inserted between the step S430 and the step S440; that is, after the cutting process CP is performed on the first thinned substrate SB1', the step S445 is carried out to perform the beveling process EP on the first sub-substrate FB1, and the step S440 is then performed to separate the thermal release adhesive layer TR from the beveled first sub-substrate FB1'.

In step S450, the electronic element ED is formed or disposed on the beveled first sub-substrate FB1' to form the electronic device 10d. The type of the electronic elements ED may be referred to as that provided in the previous embodiments and thus will not be further explained hereinafter.

So far, the manufacturing process of the electronic device 10d is completed. Although the manufacturing method of the electronic device 10d provided in this embodiment is exemplarily described by taking the above manufacturing process as an example, the manufacturing method of the electronic device 10d provided in the disclosure is not limited to what is described above. According to actual demands, some steps in the aforesaid manufacturing process may be deleted, or other steps may be added to the aforesaid manufacturing process. In addition, the order of the above steps may be adjusted according to actual needs.

To sum up, one or more embodiments of the disclosure provide the manufacturing method of the electronic device, where the thermal release adhesive layer is disposed on the surface of the first substrate where the circuit layer is disposed before the thinning process is performed on the circuit substrate (e.g., the first substrate), and another circuit substrate (e.g., the second substrate) is disposed on the first substrate through the thermal release adhesive layer. The thermal release adhesive layer may protect the circuit layers disposed on the two circuit substrates, and by increasing the temperature in the manufacturing process, the viscosity of the thermal release adhesive layer may be reduced to easily separate the two circuit substrates from each other. As such, the electronic device provided in one or more embodiments of the disclosure may be formed by performing the simplified manufacturing process, and thereby manufacturing costs and/or defects of the electronic device may be reduced.

In addition, other embodiments of the disclosure provide the manufacturing method of the electronic device, where the thermal release adhesive layer is disposed on the surface of the first substrate where the circuit layer is disposed before the thinning process is performed on the circuit substrate (e.g., the first substrate), and the acid resistant adhesive is disposed on the first substrate through the thermal release adhesive layer. The acid resistant adhesive may protect the circuit layer disposed on the circuit substrate from being corroded by the etchant in the thinning process, and by increasing the temperature in the manufacturing process, the viscosity of the thermal release adhesive layer may be reduced to easily separate the circuit substrate from the acid resistant adhesive. As such, the electronic device provided in one or more embodiments of the disclosure may be formed by performing the simplified manufacturing process, and thereby manufacturing costs and/or defects of the electronic device may be reduced.

Finally, it should be noted that the above embodiments serve to illustrate rather than limiting the technical solutions of the disclosure. Although the disclosure has been described in detail with reference to the above embodiments, persons skilled in the art should understand that the technical solutions described in the above embodiments can still be modified or some or all of the technical features thereof can be equivalently replaced. However, the modifications or replacements do not cause the essence of the corresponding technical solutions to deviate from the scope of the technical solutions of the embodiments of the disclosure. As long as the features of various embodiments do not violate the inventive spirit nor conflict with each other, the features can be mixed and matched arbitrarily.

What is claimed is:

1. A manufacturing method of an electronic device, comprising:
   providing a first substrate;
   providing a thermal release adhesive layer on the first substrate;
   providing a second substrate on the thermal release adhesive layer;

performing a thinning process simultaneously on the first substrate and the second substrate to respectively form a first thinned substrate and a second thinned substrate;

performing a cutting process on the first thinned substrate to form a first sub-substrate; and separating the thermal release adhesive layer from the first thinned substrate or the first sub-substrate.

2. The manufacturing method according to claim 1, further comprising providing an acid resistant adhesive on the thermal release adhesive layer.

3. The manufacturing method according to claim 2, wherein the acid resistant adhesive comprises a hydrofluoric acid resistant adhesive.

4. The manufacturing method according to claim 2, further comprising separating the acid resistant adhesive from the first thinned substrate or the first sub-substrate after the step of separating the thermal release adhesive layer from the first thinned substrate or the first sub-substrate.

5. The manufacturing method according to claim 2, further comprising performing the cutting process on the acid resistant adhesive.

6. The manufacturing method according to claim 1, further comprising performing a beveling process on the first sub-substrate.

7. The manufacturing method according to claim 6, further comprising placing an electronic element on the first sub-substrate after the beveling process is performed, wherein the electronic element comprises a varactor diode, a packaging element, a light emitting element, or a combination thereof.

8. The manufacturing method according to claim 1, further comprising separating the thermal release adhesive layer from the first thinned substrate before the step of performing the cutting process on the first thinned substrate.

9. The manufacturing method according to claim 1, further comprising separating the thermal release adhesive layer from the first sub-substrate after the step of performing the cutting process on the first thinned substrate.

10. The manufacturing method according to claim 1, wherein the thinning process performed on the first substrate comprises an etching process, a polishing process, or a combination thereof.

11. The manufacturing method according to claim 10, wherein the etching process comprises a wet etching process, and an etchant applied in the wet etching process comprises hydrofluoric acid.

12. The manufacturing method according to claim 1, further comprising performing the cutting process on the thermal release adhesive layer.

13. The manufacturing method according to claim 1, further comprising performing the cutting process on the second thinned substrate to form a second sub-substrate.

14. The manufacturing method according to claim 13, further comprising separating the thermal release adhesive layer from the second thinned substrate before the cutting process is performed on the second thinned substrate.

15. The manufacturing method according to claim 13, further comprising separating the thermal release adhesive layer from the second sub-substrate after the cutting process is performed on the second thinned substrate.

16. The manufacturing method according to claim 13, further comprising performing a beveling process on the second sub-substrate.

17. The manufacturing method according to claim 16, further comprising placing an electronic element on the second sub-substrate after the beveling process is performed, wherein the electronic element comprises a varactor diode, a packaging element, a light emitting element, or a combination thereof.

18. The manufacturing method according to claim 1, wherein the thinning process performed on the second substrate comprises an etching process, a polishing process, or a combination thereof.

* * * * *